(12) United States Patent
Vinogradov et al.

(10) Patent No.: US 9,137,884 B2
(45) Date of Patent: Sep. 15, 2015

(54) APPARATUS AND METHOD FOR PLASMA PROCESSING

(75) Inventors: Georgy K. Vinogradov, Sagamihara (JP); Vladimir M. Menagarishvili, Sagamihara (JP)

(73) Assignee: Lam Research Corporation, Fremont, CA (US)

( * ) Notice: Subject to any disclaimer, the term of this patent is extended or adjusted under 35 U.S.C. 154(b) by 2150 days.

(21) Appl. No.: 11/606,813

(22) Filed: Nov. 29, 2006

(65) Prior Publication Data

US 2008/0122367 A1  May 29, 2008

(51) Int. Cl.
*H01L 21/306* (2006.01)
*C23C 16/00* (2006.01)
*H05H 1/46* (2006.01)
*H01J 37/32* (2006.01)

(52) U.S. Cl.
CPC ............... *H05H 1/46* (2013.01); *H01J 37/321* (2013.01); *H01J 37/32174* (2013.01)

(58) Field of Classification Search
CPC ............. H01J 37/32128; H01J 37/32137; H01J 37/32146; H01J 37/32155; H01J 37/32165; H01J 37/32174; H01J 37/32183; H01J 37/321; H01J 37/3211; H01J 37/32119

USPC ........ 118/723 I, 723 IR, 723 AN; 156/345.48, 156/345.49; 315/111.51
See application file for complete search history.

(56) References Cited

U.S. PATENT DOCUMENTS

| | | | | |
|---|---|---|---|---|
| 4,849,675 A | * | 7/1989 | Muller | 315/111.51 |
| 5,036,252 A | * | 7/1991 | Lob | 315/111.31 |
| 5,277,751 A | * | 1/1994 | Ogle | 216/70 |
| 5,531,834 A | * | 7/1996 | Ishizuka et al. | 118/723 I |
| 5,965,034 A | | 10/1999 | Vinogradov et al. | |
| 5,976,993 A | * | 11/1999 | Ravi et al. | 438/788 |
| 6,350,347 B1 | | 2/2002 | Ishii et al. | |
| 6,531,031 B1 | * | 3/2003 | Becker et al. | 156/345.48 |
| 6,875,307 B2 | * | 4/2005 | Okumura et al. | 156/345.48 |
| 6,899,817 B1 | * | 5/2005 | Becker et al. | 216/70 |

* cited by examiner

*Primary Examiner* — Luz Alejandro Mulero
(74) *Attorney, Agent, or Firm* — Martine Penilla Group, LLP (57) ABSTRACT

The present invention discloses an apparatus for plasma processing comprising of a chamber for plasma processing with an external wall, and at least one induction coil for providing a radio frequency induction field that is adjacent to the chamber. It further includes an end terminal of the induction coil that is connected to a radio frequency power supply, another end terminal of the induction coil that is open-ended, and a grounded terminal of the induction coil that is located at substantially central position of the induction coil.

14 Claims, 6 Drawing Sheets

APPARATUS AND METHOD FOR PLASMA PROCESSING

BACKGROUND OF THE INVENTION (1) Field of the Invention

The present invention relates to an apparatus and a method for plasma processing.

(2) Description of Related Art

Inductively Coupled Plasma (ICP) sources generate inductive plasma through the inductive magnetic field, which in turn produces circular (vortex) electric field accelerating electrons to ionize process gases and sustain plasma discharge. The inductive plasma is usually characterized with medium to high plasma (electron and/or ion) density and low level of Radio Frequency (RF) potential fluctuations. Plasma chemical processes carried out in inductive plasma are fast and produce low ion damages to semiconductor wafers and devices. Well-designed inductive discharges operate in substantially wider range of discharge conditions (e.g., gas pressure and power) in comparison with Capacitively Coupled Plasma (CCP) sources.

It is known in the art that high power (up to several kilowatts) inductors carry high RF currents on the order of magnitude of about several ten amperes. Such currents according to Ohm's low generate high RF voltages of up to a few kilovolts distributed along the inductors, which cause the inductors to display capacitive properties. Therefore, the inductors can also be considered as a capacitive electrode interacting with the plasma. Inevitably, parasitic RF capacitive currents from those high voltage inductors are generated or irradiated into the discharge plasma, which produce RF fluctuations of the plasma potential. The RF fluctuations are especially harmful for plasma processing because of electrical damages to production wafers and generation of parasitic RF capacitive plasmas or RF sheaths in the process chambers. The parasitic capacitive currents from the inductors are the main cause of plasma and process non-uniformity, several kinds of damages to the process chambers (e.g., arcing) and production wafers, and substantial increase in RF power losses.

U.S. Pat. No. 5,965,034 discloses self-balanced inductors particularly as helical resonators that can generate a push-pull voltage comprised of both phase and anti-phase RF voltages. According to the RF push-pull structure, both phase and anti-phase capacitive currents are arisen in the plasma, which essentially cancel one another, obviating the capacitive problem. Nonetheless, due to impedance matching requirements for resonance, the helical resonators must fit the electrical wavelength at an excitation frequency. It is difficult to build efficient self-resonant inductors in a limited space of compact low-aspect-ratio (more or less flat) high density plasma reactors. Therefore it is desired to develop an intrinsically (self) balanced inductive plasma sources that would not require excitation at resonance.

BRIEF SUMMARY OF THE INVENTION

The present invention discloses an apparatus for plasma processing, comprising: a chamber for plasma processing with an external wall; at least one inductor for providing a radio frequency induction field that is adjacent to the chamber; an end terminal of the inductor that is connected to a radio frequency power supply; another end terminal of the inductor that is open-ended; and a grounded terminal of the inductor that is located at substantially central position of the inductor.

An optional aspect of the present invention provides an apparatus for plasma processing, wherein: the inductor is capacitively symmetric with respect to the central position.

Another optional aspect of the present invention provides an apparatus for plasma processing, wherein: capacitance to plasma caused by the inductor between one end terminal and the grounded terminal, and capacitance to plasma of the inductor between the grounded terminal and another end terminal are substantially same.

An optional aspect of the present invention provides an apparatus for plasma processing, wherein: the inductor is geometrically symmetric with respect to the central position.

An optional aspect of the present invention provides an apparatus for plasma processing, wherein: the inductor is a cylindrical spiral coil (helix).

Another optional aspect of the present invention provides an apparatus for plasma processing, wherein: the inductor is flat spiral coil.

An optional aspect of the present invention provides an apparatus for plasma processing, wherein: the chamber is dome-shape and the inductor is dome-shaped spiral coil.

Another optional aspect of the present invention provides an apparatus for plasma processing, wherein: a plurality of the inductors is provided.

An optional aspect of the present invention provides an apparatus for plasma processing, wherein: the chamber comprising a flat roof made of dielectric or semiconductor material.

Another optional aspect of the present invention provides an apparatus for plasma processing, wherein: the flat roof has at least one pair of an inside ring groove and an outside ring groove which is coaxial and adjacent to the inside ring groove.

An optional aspect of the present invention provides an apparatus for plasma processing, wherein: each of the inductors is inserted in each of the outer ring grooves.

Another optional aspect of the present invention provides an apparatus for plasma processing, wherein: each of the radio frequency power supplies is provided by each of separate independently controlled RF generators.

Another optional aspect of the present invention provides an apparatus for plasma processing, a plurality of gas inlets are penetrating at upper bottom of the inside grooves for providing process gases to the inside grooves.

An optional aspect of the present invention provides an apparatus for plasma processing, wherein: each of the radio frequency power supplies is provided by a single RF generator with a power splitter.

Another optional aspect of the present invention provides an apparatus for plasma processing, wherein: the end terminal that is open-ended is connected to a relay switch connected to ground.

Another optional aspect of the present invention provides an apparatus for plasma processing, comprising: a cylindrical chamber for plasma processing with an external wall; a gas inlet for introducing process gas into the cylindrical chamber; at least one induction coil for providing a radio frequency induction field that is cylindrical spiral and adjacently surrounds a part of the cylindrical chamber; an end terminal of the induction coil that is connected to a radio frequency power supply; another end terminal of the induction coil that is open-ended; and a grounded terminal of the induction coil that is located at geometrically central position of the induction coil.

The present invention discloses a method for plasma processing, comprising: generating a plasma by an apparatus, comprising: a chamber for plasma processing with an external wall; at least one inductor for providing a radio frequency induction field which is adjacent to the chamber; an end terminal of the inductor that is connected to a radio frequency power supply; another end terminal of the inductor that is open-ended; and a grounded terminal of the inductor that is located at substantially central position of the inductor; and processing a workpiece by using the plasma in the chamber.

These and other features, aspects, and advantages of the invention will be apparent to those skilled in the art from the following detailed description of preferred non-limiting exemplary embodiments, taken together with the drawings and the claims that follow.

BRIEF DESCRIPTION OF THE DRAWINGS

It is to be understood that the drawings are to be used for the purposes of exemplary illustration only and not as a definition of the limits of the invention. Throughout the disclosure, the word "exemplary" is used exclusively to mean "serving as an example, instance, or illustration." Any embodiment described as "exemplary" is not necessarily to be construed as preferred or advantageous over other embodiments.

Referring to the drawings in which like reference character (s) present corresponding parts throughout.

DETAILED DESCRIPTION OF THE INVENTION

The detailed description set forth below in connection with the appended drawings is intended as a description of presently preferred embodiments of the invention and is not intended to represent the only forms in which the present invention may be constructed and/or utilized.

(a) First Embodiment

Figure 1:
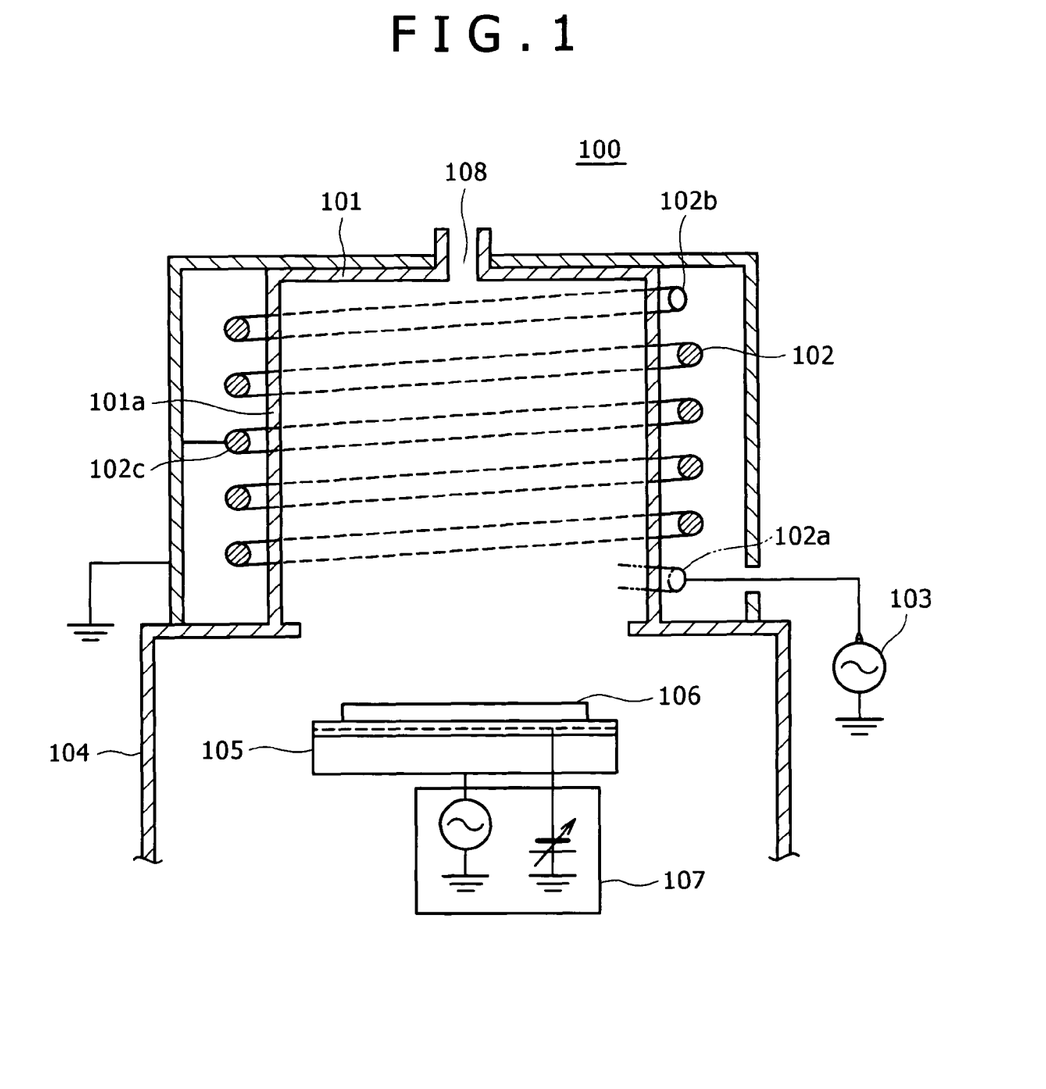
FIG. 1 is an exemplary cross-sectional view of an apparatus for plasma processing according to a first embodiment.

FIG. 1 is an exemplary illustration of a simplified cross-sectional view of the plasma processing apparatus according to the present invention. The plasma processing apparatus 100 includes an induction chamber 101 that is coupled with a process chamber 104, therefore the process gases can be provided to a workpiece 106 from a gas inlet 108. The process chamber 104 is equipped with a pedestal 105 that is temperature-stabilized (temperature stabilized susceptor or an electrostatic chuck—ESC), and is coupled with a controlled bias RF power supply 107. The controlled bias RF power supply 107 is independently controlled from a RF power supply 103, which provides RF signal frequencies ranging from 800 kHz to 80 MHz to an inductive coil 102. A preferred, non-limiting exemplary RF signal frequencies range from 1 MHz to 60 MHz may be used plasma etching.

Figure 2:
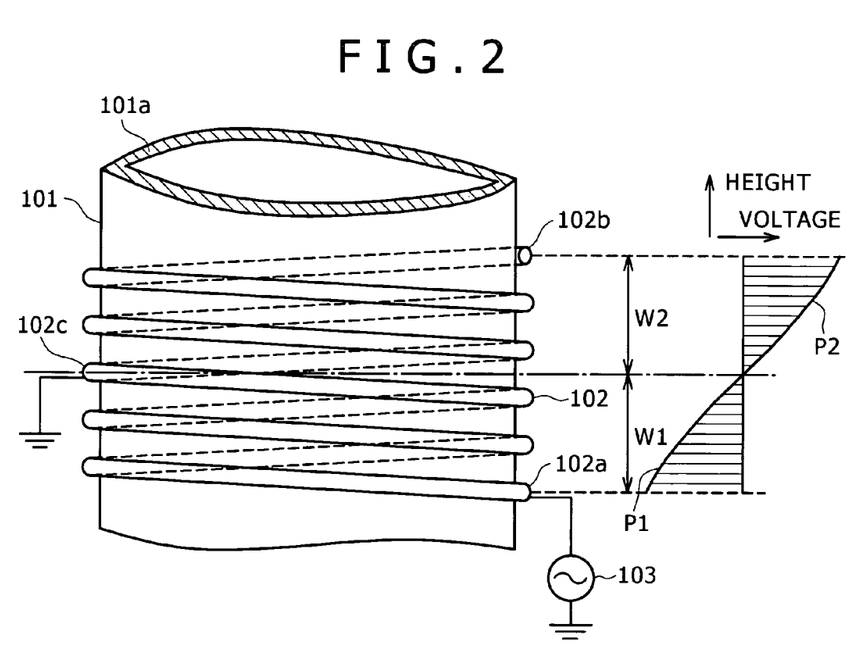
FIG. 2 is an exemplary side view of the induction coil and the induction chamber.

FIG. 2 is an exemplary illustration of a side view of the induction chamber 101 and the induction coil 102 (illustrated in FIG. 1). In the drawing, the induction chamber 101 has an external wall 101a, with a non-limiting exemplary cylindrical configuration. It should be noted that the induction chamber 101 can be configured in other shapes or geometries, a few, non-limiting examples of which may include, flat ceiling, truncated pyramid, rectangular, etc. Depending upon the plasma processing application, the chamber configuration is selected to produce a uniform entity density over the pedestal 105, providing a high density of entities (i.e., etchant species) for processing uniformity. The external wall 101a includes an interior surface made of quartz or other suitable materials. The exterior surface of the external wall 101a is typically a dielectric material such as ceramic or the like, so that the induction coil 102 can communicate with the plasma discharge volume through the external wall 101a. The chambers 101 and 104 also include a process kit (not shown) with a focus ring, a cover (not shown), and other elements.

Correspondingly to the shape of the chamber 101, the induction coil 102 constitutes an even shaped cylindrical spiral coil that adjacently surrounds the external wall 101a, non-limiting examples of which may include any inductors such as a coil, antenna, transmission line, etc. The induction coil 102 has an end terminal 102a coupled with the RF power supply 103 and another end terminal 102b that is open-ended. Further, the induction coil 102 has a grounded terminal 102c with a position that is substantially central about the length of induction coil 102, with the height of the grounded terminal 102c intermediate between the heights of the end terminals 102a and 102b.

Figure 3:
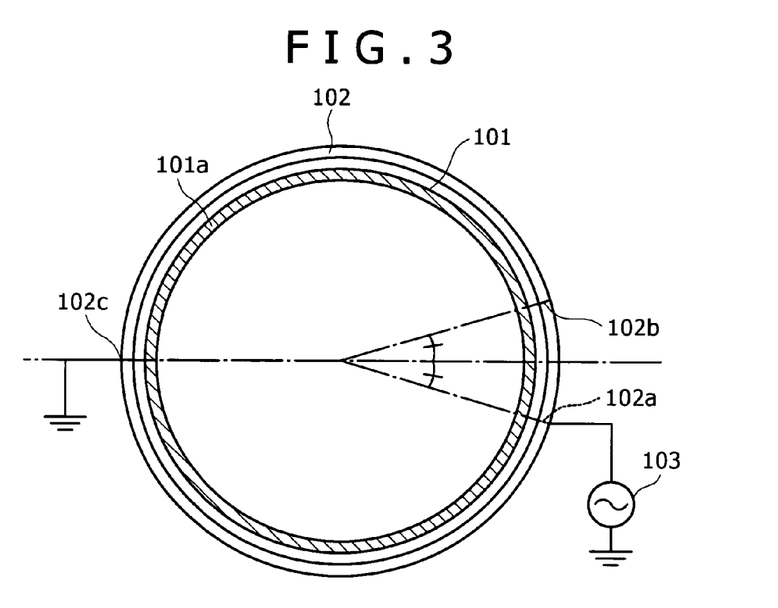
FIG. 3 is an exemplary top view of the induction coil and the induction chamber.

FIG. 3 is an exemplary illustration of a top view of the induction coil 102, including the end terminals 102a and 102b, and the grounded terminal 102c. As illustrated, the radial angle of the grounded terminal 102c with reference to the shown vertical axis of induction coil 102 is intermediate between the shown radial angles, with reference to the shown vertical axis of induction coil 102, of the end terminals 102a and 102b. Therefore, the length of the lower winding W1 is substantially equal to the length of the upper winding W2. In addition, the number and diameter of the turns of the lower winding W1 is substantially equal to those of the upper winding W2. In other words, the grounded terminal 102c is located at center of the induction coil 102, making the induction coil 102 geometrically symmetrical with respect to the grounded terminal 102c. Further, the chamber 101 is geometrically symmetrical shape with respect to the height of the grounded terminal 102c because the chamber 101 is cylindrical. Nevertheless, the grounded terminal 102c is not required to be at exact center, but at substantially centered with some variation because the induction coil 102 and the induction chamber 101 may have variation in shapes and electrical inductive and capacitive behaviors.

When the RF power is provided to the induction coil 102, the ICP sources are generated through the inductive magnetic field of the induction coil 102. The magnetic field in turn produces circular (vortex) electric field accelerating electrons, which ionizes the process gases and sustains plasma discharge. The induction coil 102 generates an approximate equal phase (P1) and anti-phase (P2) integral capacitive potentials (i.e., voltages) through the plasma discharge into an electrical ground. The end terminal 102b develops equal and opposite voltage against to the RF voltage at the opposite end terminal 102a due to the upper portion and the lower portion of the induction coil 102 having a common induction field.

Alternatively, an induction coil 102 can be thought as a coil composed of two substantially identical coils. One coil (the lower winding W1) carries high inductive current for generating circular induction electric field in the plasma discharge, while another coil (the upper winding W2) serves substantially as a capacitive compensator of the capacitive current generated by the first coil (the lower winding W1).

The lower winding W1 and the upper winding W2 substantially balance each other due to the fact that both the induction coil 102 and the chamber 101 are geometrically symmetric in respect to the height of the grounded terminal 102c. Therefore, the integral parasitic capacitive current among inductor-plasma-ground is virtually canceled, resulting in a balanced inductor-plasma capacitive interaction. This capacitive balance is determined by the degree of integral capacitive voltage symmetry of the inductor-plasma capacitive interaction. The higher the symmetry, the greater is the reciprocally commensurate or corresponding opposing voltages on the lower and upper winding, and the better capacitive balance with minimized net capacitive current of inductor-plasma is achieved. The capacitively balanced inductive plasma sources are especially useful in semiconductor plasma processing.

In the process chamber 104, equipped with the pedestal 105 that is coupled with the controlled bias RF power supply 107, the capacitively balanced inductive plasma sources generate a high voltage sheath accelerating positive ions onto the workpiece 106. Initial process gases enter into the induction chamber 101 and undergo ionization and dissociation in the RF discharge bulk plasma generated by the capacitively balanced inductive plasma source. The workpiece 106 on the pedestal 105 is processed by the particles, at least one kind of which is supplied from the discharge plasma generated by the capacitively balanced inductive plasma source.

The RF power supply 107 can independently control RF bias power on the pedestal 105 for adjusting the rate and characteristics of plasma-surface interactions, and hence, the results of plasma processing. Accordingly, a decoupled plasma processing occurs. Process engineers can set up and control semiconductor manufacturing processes in a widest range of conditions or recipes, a few non-limiting examples of which may include discharge power, gas pressure, flow rate, etc. The decoupled plasma processes realize low, medium, and high density plasma gas discharge regimes.

Non-limiting examples of a few typical applications of the above described processes may include etching of metals, dielectrics, semiconductors, or the like; surface modification like nitridation, oxidation, plasma implantation; and deposition of various thin films using plasma enhanced Chemical Vapor Deposition (CVD). Other non-limiting examples of a few typical applications of the above described processes may include manufacture of glass or plastic substrates and/or modifications thereof, which use the above described plasma sources and processes. Therefore, the present invention is not limited to semiconductor processing, but is contemplated to be applicable to other exemplary processing such as mask manufacturing, optical, micro-electro-mechanical (MEMS technology), medical, and other device processing. In particular, the cylindrical plasma sources like the disclosed present embodiment can be used in many cases for either plasma etching/CVD or downstream (down-flow or remote) applications like resist ashing (stripping) for removing resists hardened in selective photo exposure.

It should be noted that the self-balanced inductors do not need additional elements for balancing. Their intrinsic capacitive structure itself possesses a high degree of capacitive symmetry under the widest range of gas discharge process conditions, including the excitation frequency. Therefore, the plasma processing apparatus according to the present invention can be simple, cheap and easy to operate. Further, induction coil 102 generates half RF voltages and reduces the capacitive potential because induction coil 102 is grounded at its halfway point, and only the half of the length of the induction coil 102 affects the RF voltages.

(b) Other Embodiments

Figure 4:
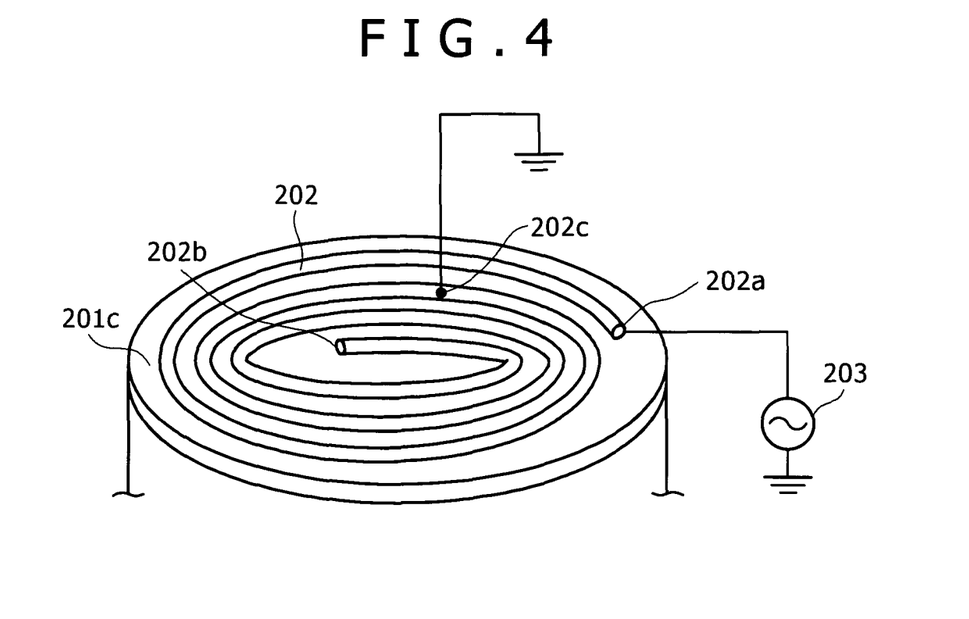
FIG. 4 is an exemplary perspective view of an apparatus for plasma processing equipped with a flat spiral induction coil.

FIG. 4 is an exemplary illustration, showing a pancake configured capacitively symmetric inductor for a commensurately configured flat roof induction chamber. The induction coil 202 is a flat spiral coil adjacent to a flat roof 201c. The flat roof 201c is made of dielectric materials to allow the induction coil 202 to communicate with the plasma discharge volume through the flat roof 201c.

Figure 5:
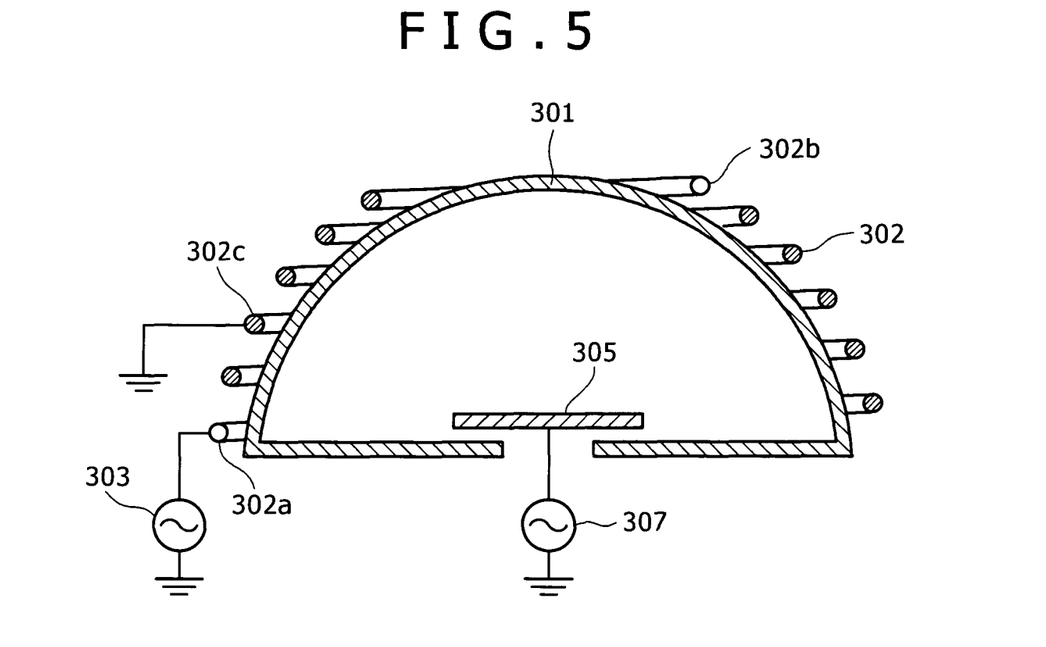
FIG. 5 is an exemplary cross-sectional view of an apparatus for plasma processing equipped with a dome-shaped induction coil.

FIG. 5 is an exemplary illustration of a capacitively symmetric inductor for a dome-shaped chamber. The external wall (vessel) 301a of the camber 301 is dome-shaped (hemisphere), with a correspondingly configured induction coil 302 that is a dome-shaped spiral coil. The induction coil 302 adjacently surrounds the external wall 301a of the camber 301. The camber 301 is made of dielectric or semiconductor materials to allow the induction coil 302 to communicate with the plasma discharge volume through the external wall 301a.

In these embodiments, the shapes of the induction coils 202 and 302 are not geometrically symmetric. However the induction coils 202 and 302 are not necessary to be geometrically symmetric but to be capacitively symmetric to apply the present invention. The induction coils 202 and 302 have a pair of end terminals 202a and 302a connected to the RF power supplies 203 and 303, end terminals 202b and 302b that are opened, and have grounded terminals 202c and 302c. Although the induction coils 202 and 302 have to be capacitively symmetric with respect to the grounded terminals 202c and 302c, nonetheless, they have substantially non-equivalent external and internal turns with different diameters, and therefore, inductance. The formulation of the capacitively balancing position of the induction coils 202 and 302 is difficult because the capacitive current inductor-plasma-ground depends on interactions of some environmental factors. Consequently, the positions of grounded terminals 202c and 302c are detected experimentally to minimize the net capacitive current inductor-plasma-ground.

Figure 6:
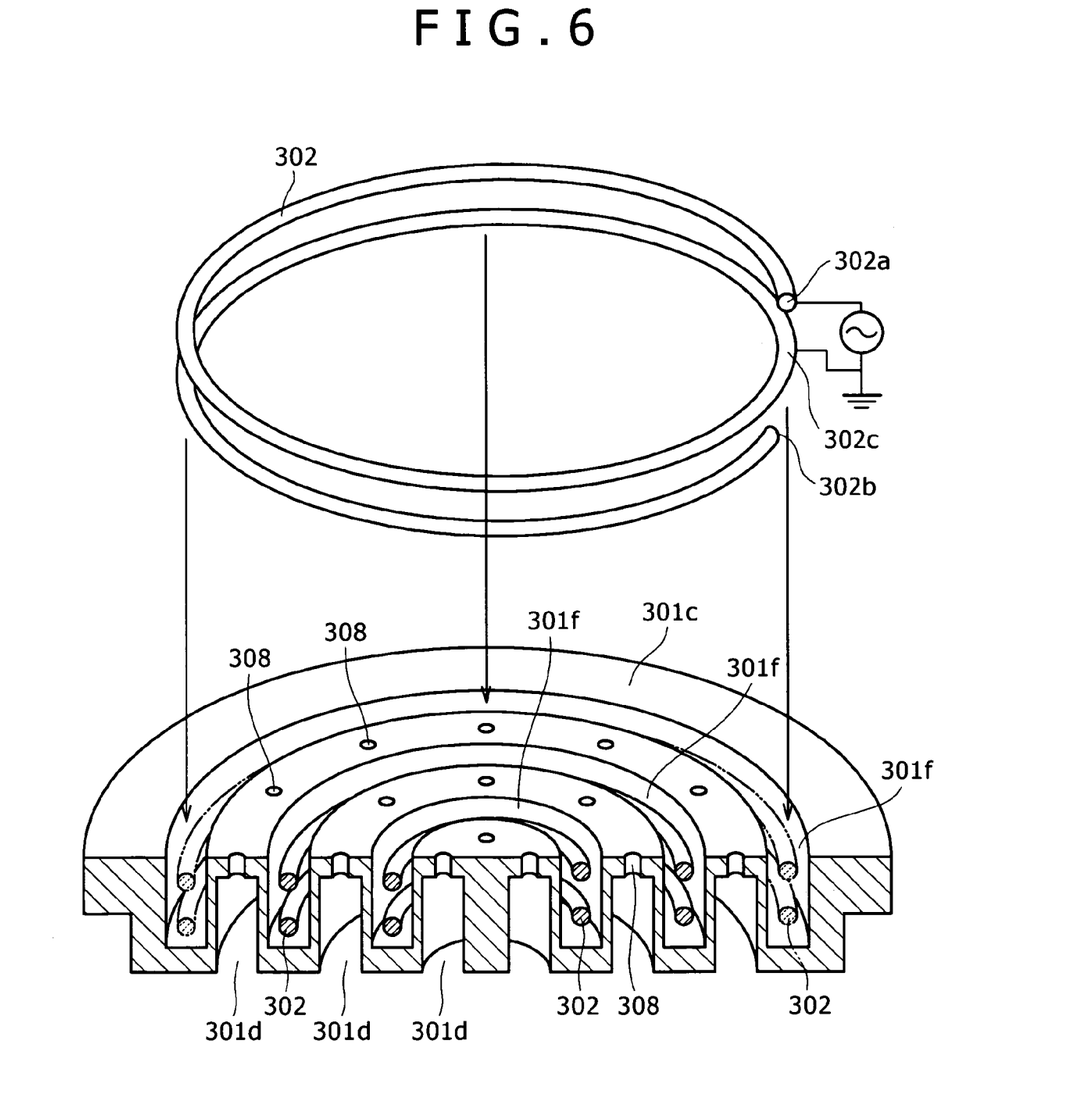
FIG. 6 is an exemplary cross-sectional perspective view of a flat roof with grooves.

FIG. 6 is an exemplary illustration that shows a cross-sectional perspective view of a flat roof 301c, which can be made from, for example, silicon, ceramics, sapphire, quartz, or other dielectric or semiconductor materials. The roof 301c has three pair of inside grooves 301d and outside grooves 301f, which are configured as ring shape, coaxial and alternately adjacent each other. There are several gas inlets 308 penetrating the (upper) bottoms of the inside grooves 301d for providing process gases to the inside grooves 301d, with each of the three induction coils 302 inserted into each of the outside grooves 301f. To achieve a higher vertical symmetry, the number of turns of the induction coils 302 can be increased (e.g., four turns).

Figure 7:
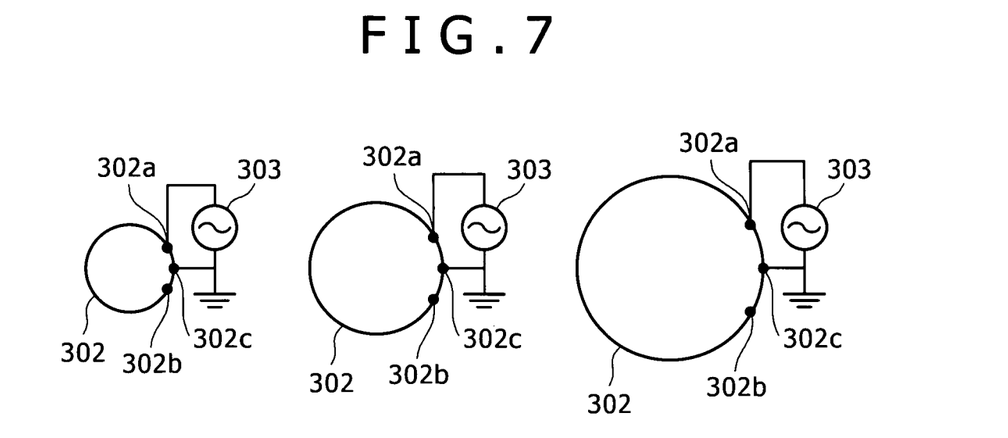
FIG. 7 is an exemplary circuit diagram of multi induction coils.
Figure 8:
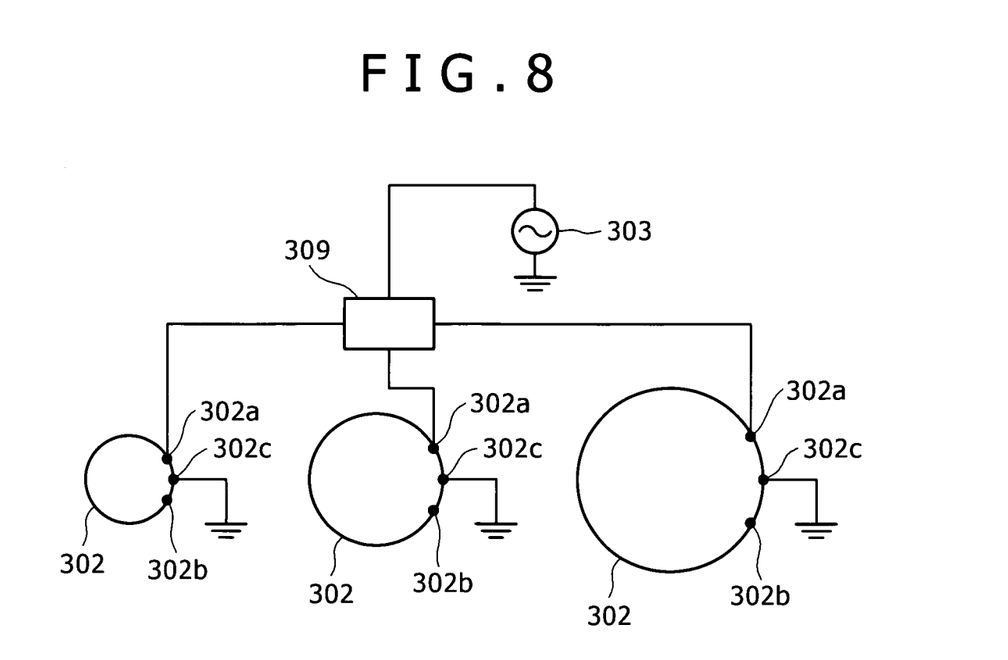
FIG. 8 is an exemplary circuit diagram of multi induction coils.

FIG. 7 is an exemplary illustration that shows a circuit diagram of the induction coils 302, with each of the induction coils 302 representing a low aspect ratio compact ring-shape cylindrical inductor having end terminals 302a connected to independent RF power supplies 303, end terminals 302b that are opened, and grounded terminals 302c. The induction coils 302 are geometrically symmetrical with respect to the grounded terminals 302c. The induction coils 302 can be electrically energized from separate RF power supplies 303 with independent power control, or alternatively, the induction coils 302 can be fed from one or two RF generators with corresponding power splitters controlling the discharge power in every coil. FIG. 8 is an exemplary illustration that shows a circuit diagram having one power splitter 309. The power splitter 309 is fed from a single RF power supply 303, and splits (or divides) an RF power into three induction coils 302, with each of the induction coils 302 generating independent ring discharges in the inside grooves 301d.

Figure 9:
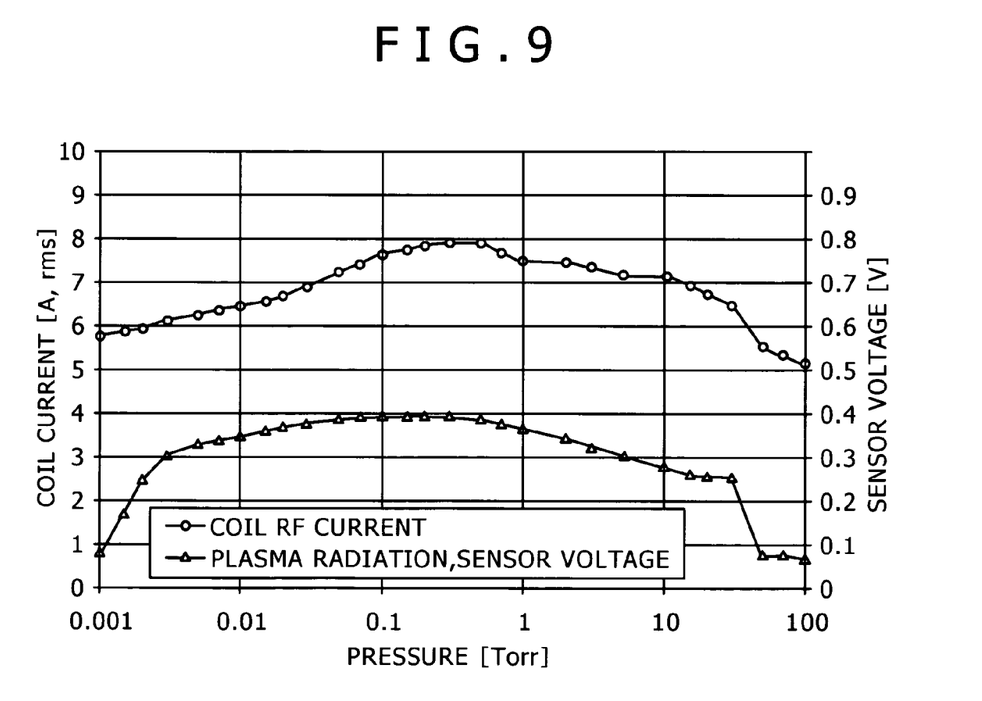
FIG. 9 is an exemplary graph shows a pressure range of stable ICP discharge.

FIG. 9 is an exemplary illustration that shows a pressure range of stable ICP discharge with the induction coils 302. Up to about 3000 watt RF discharge is generated using just a single balanced coil in a grooved roof of an industrial 300-mm wafer etcher manufactured by FOI Corporation in Japan. The operating pressure range covers five orders of magnitude from 1 mTorr to 100 Torr. Such discharge performance proves extraordinary merits of the self-balanced inductors according to the present invention. It should be noted that the coil current is virtually constant (from 6 to 8 A, rms) in the entire pressure range in this experimental example. Hence, the true discharge power is also about constant in such a wide process range of five orders of magnitude. Other plasma etchers without the grooved roof have never achieved such a wide process range performance.

Although the invention has been described in considerable detail in language specific to structural features or method acts, it is to be understood that the invention defined in the appended claims is not necessarily limited to the specific features or acts described. Rather, the specific features and acts are disclosed as preferred forms of implementing the claimed invention. Therefore, while exemplary illustrative embodiments of the invention have been described, numerous variations and alternative embodiments will occur to those skilled in the art. For example, the inductors can be hollow tubular coils. Such variations and alternate embodiments are contemplated, and can be made without departing from the spirit and scope of the invention.

It is to be understood that the phraseology and terminology employed herein, as well as the abstract, are for the purpose of description and should not be regarded as limiting.

It should further be noted that throughout the entire disclosure, the labels such as left, right, front, back, top, bottom, forward, reverse, clockwise, counter clockwise, up, down, or other similar terms such as upper, lower, aft, fore, vertical, horizontal, proximal, distal, etc. have been used for convenience purposes only and are not intended to imply any particular fixed direction or orientation. Instead, they are used to reflect relative locations and/or directions/orientations between various portions of an object.

In addition, reference to "first," "second," "third," and etc. members throughout the disclosure (and in particular, claims) is not used to show a serial or numerical limitation but instead is used to distinguish or identify the various members of the group.

What is claimed is:

1. An apparatus for plasma processing, comprising:
   a chamber for plasma processing with an external wall; and
   at least one inductor adjacent to the chamber for providing a radio frequency induction field, wherein the inductor is a cylindrical spiral coil that surrounds a part of the chamber, the inductor including,
   an end terminal connected to a radio frequency power supply;
   another end terminal that is open-ended; and
   a grounded terminal that is directly coupled to electrical ground at a position that is substantially central about a length of the inductor between the end terminal and the other end terminal;
   wherein the other end terminal that is open-ended develops equal and opposite voltage against voltage at the end terminal that is connected to the radio frequency power supply.

2. The apparatus for plasma processing as set forth in claim 1, wherein:
   the inductor is capacitively symmetric with respect to the position that is substantially central.

3. The apparatus for plasma processing as set forth in claim 2, wherein:
   capacitance to plasma caused by the inductor between one end terminal and the grounded terminal, and capacitance to plasma of the inductor between the grounded terminal and the other end terminal are substantially same.

4. The apparatus for plasma processing as set forth in claim 1, wherein:
   the inductor is geometrically symmetric with respect to the position that is substantially central.

5. The apparatus for plasma processing as set forth in claim 1, wherein:
   a radial angle of the grounded terminal with reference to an axis of the cylindrical spiral coil is intermediate between radial angles of the end terminal and the other end terminal with reference to the axis.

6. An apparatus for plasma processing, comprising:
   a cylindrical chamber for plasma processing with an external wall;
   a gas inlet for introducing process gas into the cylindrical chamber; and
   an induction coil for providing a radio frequency induction field, wherein the induction coil is cylindrical spiral and adjacently surrounds a part of the cylindrical chamber, wherein the induction coil includes,
   an end terminal connected to a radio frequency power supply;
   another end terminal that is open-ended; and
   a grounded terminal that is directly coupled to electrical ground at a geometrically central position of the induction coil between the end terminal and the other end terminal;
   wherein the other end terminal that is open-ended develops equal and opposite voltage against voltage at the end terminal that is connected to the radio frequency power supply.

7. The apparatus for plasma processing as set forth in claim 6, wherein:
   the induction coil is capacitively symmetric with respect to a position that is substantially central about a length of the induction coil between the end terminal and the other end terminal.

8. The apparatus for plasma processing as set forth in claim 6, wherein:
   capacitance to plasma caused by the induction coil between one end terminal and the grounded terminal, and capacitance to plasma of the induction coil between the grounded terminal and the other end terminal are substantially same.

9. The apparatus for plasma processing as set forth in claim 6, wherein:

the induction coil is geometrically symmetric with respect to a position that is substantially central about a length of the induction coil between the end terminal and the other end terminal.

10. The apparatus for plasma processing as set forth in claim 6, wherein:
a radial angle of the grounded terminal with reference to an axis of the induction coil is intermediate between radial angles of the end terminal and the other end terminal with reference to the axis.

11. An apparatus for plasma processing, comprising:
a chamber for plasma processing; and
an inductor adjacent to the chamber for providing a radio frequency induction field, wherein the inductor is a cylindrical spiral coil that surrounds at least a part of the chamber, the inductor including:
a first terminal at a first end of the cylindrical spiral coil, the first terminal connected to a radio frequency power supply, the first terminal being at a first angle radially with reference to an axis of the cylindrical spiral coil;
a second terminal at a second end of the cylindrical spiral coil, the second terminal being open ended and at a second angle radially with reference to the axis; and
a grounded terminal at a position that is substantially central about a length of the cylindrical spiral coil between the first end and the second end, the grounded terminal being directly coupled to electrical ground and at a third angle radially with reference to the axis, wherein the third angle of the grounded terminal is intermediate between the first angle and the second angle.

12. The apparatus for plasma processing as set forth in claim 11, wherein:
the inductor is geometrically symmetric with respect to the position that is substantially central.

13. The apparatus for plasma processing as set forth in claim 11, wherein the first angle has a different value from the second angle.

14. The apparatus for plasma processing as set forth in claim 13, wherein the third angle is halfway between the first angle and the second angle.

* * * * *